United States Patent [19]

Tibbetts

[11] 4,291,116

[45] Sep. 22, 1981

[54] METHOD OF IMAGE REPRODUCTION AND MATERIALS THEREFOR

[76] Inventor: Charles C. Tibbetts, 800 Inverness Dr., Flintridge, Calif. 91101

[21] Appl. No.: 58,816

[22] Filed: Jul. 19, 1979

Related U.S. Application Data

[63] Continuation-in-part of Ser. No. 846,325, Oct. 28, 1977, abandoned.

[51] Int. Cl.$^3$ .............................................. G03C 5/00
[52] U.S. Cl. .................................. 430/308; 430/271; 430/327; 430/328
[58] Field of Search ................ 430/308, 327, 328, 271

[56] References Cited

U.S. PATENT DOCUMENTS

| | | | |
|---|---|---|---|
| 1,064,166 | 6/1913 | Pindikowsky | 96/36.4 |
| 2,791,504 | 5/1957 | Plambeck | 96/35.1 |
| 3,507,652 | 4/1970 | Wrench | 430/308 |
| 3,507,654 | 4/1970 | Wrench | 430/308 |
| 3,510,303 | 5/1970 | Preddy et al. | 430/308 |
| 3,615,450 | 10/1971 | Werber et al. | 96/35.1 |
| 3,730,715 | 5/1973 | Ketley et al. | 96/35.1 |
| 3,826,650 | 7/1974 | Schlesinger | 430/308 |
| 3,837,887 | 9/1974 | Akamatsu et al. | 96/35.1 |
| 4,038,078 | 7/1977 | Sakurai et al. | 96/35.1 |
| 4,048,035 | 9/1977 | Ide et al. | 96/35.1 |
| 4,090,936 | 5/1978 | Barton | 96/35.1 |
| 4,209,582 | 6/1980 | Merrill et al. | 430/308 |
| 4,216,019 | 8/1980 | Reed et al. | 430/308 |
| 4,216,287 | 8/1980 | Sano et al. | 430/308 |

Primary Examiner—Richard L. Schilling
Attorney, Agent, or Firm—Fraser and Bogucki

[57] ABSTRACT

A high resolution image is accurately but readily reproduced by placement of a film master, such as a positive photographic film, in direct contact with a wet, high solids content, radiation curable material distributed on a screen. The radiation curable material is responsive to a limited wavelength band in the ultraviolet region. It includes a sensitizer, may include a reactive diluent, is preferably free of acrylates and of low toxicity, has a viscosity sufficient to maintain a fixed spatial relationship between the master and substrate, and further advantageously incorporates a minor amount of radiation attenuating dimensional stabilizer in the form of a distributed particulate. The photopolymer material is first spread across one side of the screen against the film master to form an underlayer which is then irradiated through the film master with a suitable light source. An overlayer of more than desired thickness is spread on the second side and irradiated for a time interval proportioned to the thickness of the screen, to provide a uniform and preselected depth of overlayer that is chemically bonded to the underlayer. The master is then stripped off without damage, the uncured material removed, and the reproduced image is post cured by exposure from the side opposite the prior exposures. The result is a high resolution, extremely durable image in which the filaments are fully encapsulated by material in the cured stencil regions. Both permanent and reclaimable stencils may be made, and a given photopolymer system may be utilized with a wide range of mesh sizes.

28 Claims, 10 Drawing Figures

SCREEN PRINT USING PHOTOSTECIL IN ACCORDANCE WITH INVENTION (500X)

STRAIGHT EDGES OF ORIGINAL IMAGES

SCREEN PRINT USING PRIOR ART DIAZO STENCIL (500X)

STRAIGHT EDGES OF ORIGINAL IMAGES

METHOD OF IMAGE REPRODUCTION AND MATERIALS THEREFOR

This application is a continuation-in-part of my previously filed application for patent entitled "Method Of Image Reproduction And Materials Therefor", filed Oct. 28, 1977, Ser. No. 846,325, now abandoned.

BACKGROUND OF THE INVENTION

Screen printing photostencil systems, as presently known, are almost entirely based upon the so-called "indirect" or "direct" photostencils, or upon a "direct-/indirect" variant which combines some of the aspects of each. The indirect or transfer photostencil utilizes a light sensitive emulsion which is precoated on a paper or plastic base, and sensitized by bichromate or iron salts. When held in place relative to a film master by a vacuum frame or similar device, the sensitized film is exposed to actinic light. Thereafter the unexposed emulsion is washed away. Following this, the stencil can be mounted onto a screen, and after drying the paper or plastic base can be stripped away.

Indirect photostencils are thus applied to one surface of a screen, and although they offer high resolution (high print quality) because the thin stencil image can lie flush against a printing surface, they also have limited durability (due to the brittleness and low abrasive resistance) and are seldom used for more than a few hundred prints. The process for preparing such stencils is time consuming and critical in many respects. For example, the fabric preparation, sensitizing if required, washing and drying sequences can take up to an hour, and have to be conducted under controlled conditions and without exposure to ambient light. Further, the exposure time has little latitude and the temperature and humidity may also have to be controlled to provide a useful stencil. The need for a vacuum frame or comparable holder cannot be avoided.

In the direct photostencil, after sensitizing, the photosensitive emulsion is coated on both sides of the mesh, although some expertise is needed to insure an even coat. In order to obtain an adequate thickness this is usually done by successive drying and coating steps, each of which take a substantial amount of time. The direct photostencil is substantially more durable than the indirect stencil, and can be used to make thousands of copies, but with substantially lower resolution than the indirect photostencil. Because the surface of the emulsion tends to follow the contour of the mesh upon shrinkage when water is dried off, there is poor contact with the printing stock and a decrease in print quality, and if the photostencil is not carefully prepared, quality is lost for this reason as well. In any event, the direct photostencil also requires substantial drying time or the use of special drying procedures, and a substantially longer exposure time than does the indirect photostencil.

The so-called direct/indirect photostencil provides a flat surface on one side of the mesh by applying a precoated base that is laminated to the mesh with a sensitized emulsion coated on the inside of the screen. This laminate is then dried and the support layer is stripped away, and the mesh is then coated as in the direct system. This technique provides a resolution approaching that of the indirect system, because the flat base surface on one side can be flush with the printing stock and because there can be more consistent control of thickness. However, the time taken to prepare the sensitized coating, the limited shelf life, drying time, and the need for a vacuum frame still constitute drawbacks, and in addition the direct/indirect method is substantially more expensive than the other techniques.

The state of the art in preparing high quality photostencils looks to a number of practical factors that must be evaluated in considering any competitive system. It is desirable to avoid specialized coating steps that require a high level of skill and experience, as well as the use of chemicals having inherent instabilities and limited shelf life. Capital costs are of importance, and in this respect it is desirable to avoid the usage of vacuum frames and special light sources. It would also be desirable to obtain the resolution of the indirect system, with the durability of the direct photostencil, or to improve on each of such properties, but without imposing a cost penalty. In addition, some sensitizers such as the widely used dichromates present occupational health problems because of their toxicity. Other sensitizers present occupational health problems because they incorporate substantial amounts of solvents which must be evaporated and therefore present significant contamination problems in a closed processing room.

The present state of the art seeks to have a stencil exhibiting minimal "sawtoothing", or a tendency to follow the outlines of successive intersections of the mesh rather than the precise curvature or line defined by an edge of the film master. The sawtooth effect is dependent upon the mesh size, the material used and the orientation of the image edge to the filaments of the mesh. The stencil must have a good "bridging" property, and follow the curved or straight edge of an image in traversing across the openings of the screen. The photostencil should also be free of "undercutting" to the greatest extent possible, this effect arising when light scattering causes exposure within marginal image areas that are not intended to be exposed. The quality of the resolution of a photostencil can be determined by using a master image having test lines and patterns involving different resolutions. A photostencil is considered as having high resolution when it can be used to reproduce lines of 0.1 mm width with less than 0.01 mm undercut. A photostencil is also considered to be adequately durable if it can be used for making a few thousand copies, and withstand several washouts. It is evident, however, that it would be preferred if a substantially greater number of copies could be made. In addition, it is often desired to be able to remove the stencil image, and to reuse or "reclaim" the screen once or repeatedly for successive stencil images, or store screens for future use without deterioration. Common difficulties in this respect are excessive brittleness and water absorption.

The particular requirements that are encountered in making photostencils thus may be viewed in terms of preparing a precision, three dimensional but planar composite of filamentary screen and adhering stencil. This composite must have precise relationships between the screen and the stencil in the thickness dimension, along the edges of the stencil, and throughout the two dimensional pattern constituting the stencil image. The resultant image must adhere to the screen firmly, throughout many printings, even though the image may include extremely small incremental areas. For example, a stencil dot may approximate in area the area of the individual opening of a very fine mesh as long as it is secured by two filaments in each direction. Moreover, the preparation of a photostencil is essentially a manual operation, and one that must be adaptable to a wide range of conditions. For example, it may be necessary to prepare stencils on a wide variety of screen materials, and in sizes ranging from 16 to 508 strands per inch and more. The time and skill required to prepare the screen for exposure are both important in terms of labor costs. The equipment and techniques required to retain and expose the stencil are only partially determinative of capital costs. One must also consider the need for venting or control of toxic fumes, the usage of drying equipment and techniques for limiting light exposure. A major practical problem is that photostencil preparation can involve the usage at different times of many different mesh sizes, fabric types, and printing inks to meet particular image sizes and resolutions and specific printing requirements.

Workers in the art have not heretofore used other, radically different photosensitive materials, in preparing photostencils on a commercial basis. It has been suggested, as in U.S. Pat. No. 3,891,441, to employ photopolymerizable layers on opposite sides of a backing support, typically a printing paper. Although it is suggested that this might also comprise a mesh screen of nylon or silk, the only examples given are of thin paper for mimeographic use. The principal concept is to use the cover layers partially to define the thickness of the polymerizable layer (e.g. 40 microns including the paper) and to permit the cover layers to be stripped freely from the exposed regions, while adhering to the unexposed and unpolymerized regions, so that only the desired image is retained on the printing paper. Using stencils thus prepared in a mimeographic or hand rotary printing process, 500 and 700 copies were all that were reproduced. U.S. Pat. No. 3,891,441 also describes the incorporation of a substantial amount of filler material, such as powdered zinc oxide or carbon black, for the purpose of controlling the adhesion of the photopolymerizable layer to the cover layer. The techniques of this patent obviously do not satisfy the requirements of the modern photostencil industry, in terms of precision or durability, and although the exposure times required for thin photopolymerizable layers are relatively short, the need for a vacuum frame still exists.

The use of a photopolymerizable substance to prepare a relief image is discussed in U.S. Pat. No. 3,297,440, in terms of planographic printing plates as for offset printing methods, matrices for printing matter, silk screen printing stencils, and plastic or metal printing cylinders. However, no examples are given of the manner in which silk screen stencils can be prepared and the only examples of the preparation of an image from a film master involve the use of an aqueous solution as a layer upon a backing film, following which a process transparency is laid over it, and the three elements in the laminate are then pressed between two glass plates for illumination of the light sensitive layer through the transparency. This then provides a relief image, but there is no suggestion as to how a screen stencil meeting the requirements of the modern art could be provided.

U.S. Pat. No. 3,658,529 proposes the fabrication of photographs, using photocurable compositions that are sensitive to ultraviolet light, instead of conventional silver photographic emulsions. It is suggested that the photopolymer can be of any viscosity within a wide range, and that it be disposed on a porous essentially transparent layer such as a film or a fiber sheet. The objective is simply to provide a base for supporting the photographic image, and there is no showing or suggestion of how an image could be prepared that would be suitable for providing a screen-based composite image of the type required for the photostencil industry. Thus examples 2, 3 and 22-27 of the patent deal with the preparation of positive half tone images on various substrates. There is no confrontation of the problem of retention of the film master or preparation of a durable but extremely precise stencil image.

Another mention of the usage of a photopolymer to prepare a stencil image is contained in U.S. Pat. No. 3,826,650. In this patent, which deals primarily with the photosensitizer employed, it is suggested that a paper or silk screen stencil can be provided by impregnating a layer with the photopolymer solution, exposing through a negative, and removing the unexposed liquid or monomer. A similar general discussion is contained in U.S. Pat. No. 3,961,961 which additionally proposes that the photosensitive layer can be given a tacky characteristic, such that it will adhere to adjacent support and release layers that are used prior to attachment of the photosensitive layer to a screen or paper. Although it is mentioned that the screen may be reclaimable through the use of an acidic acid solvent, it is also specifically required to utilized a vacuum frame for holding the film master. It is noted for completeness that subsequent to the filling of the parent of this application, Belgian Pat. No. 869,190 issued on Nov. 16, 1978, proposing largely the use of certain chemical mixtures for preparing stencils from photopolymer systems.

It is also generally known to make printing plates from photopolymers, as evidenced by U.S. Pat. Nos. 4,137,081, 4,139,436, 4,022,674, 4,011,084 and 3,982,492. There are, however, fundamental differences between the preparation of printing plates and photostencil screens. The printing plate has a raised image protruding from the cylinder base or other substrate. It is desirable, therefore, in these systems to provide a high hardness but low brittleness, and to have tapered sides so as to provide better structural support for the dots or elements forming the printing image to meet other specific requirements concerned with that industry.

In the preparation of printing plates, as evidenced by U.S. Pat. Nos. 2,791,504, 3,615,450, 3,837,887, 4,048,035 and 4,147,549 it is common practice to employ an antihalation layer between the base and the photopolymer layer, which is usually retained within a frame or well. The thickness of the layer is determined by the dimensions of the peripheral gasket, frame or shims that are used, with or without a doctor blade or an intermediate layer such as a plastic film or a glass sheet. Although the master film itself may be coated with a protective layer and placed directly in contact with the photopolymer layer, it usually is preferred to incorporate an air gap and to expose using a source which enhances the tapered relief characteristic that is desired. Generally, a wide band light source in the wavelength region of 200 to 400 nanometers is employed. The art includes a number of suggestions as to dyes and pigments, including carbon black, that might be used within the anti-halation layer underneath the relief image, or in the photopolymer itself, for general purposes that are often contradictory in nature. Thus U.S. Pat. No. 2,791,504 suggests that dyes and pigments in the photopolymer serve no useful purpose because they tend to prevent penetration of light to the lower portions of the sensitive material, while U.S. Pat. No. 4,038,078 suggests that dyes can be used for control of photosensitivity, improvement of wave length selectivity, prevention of halation and the like. The combined teachings in this art neither indicate how the many requirements of the photostencil industry may be met, nor do they appear to have been used in that industry.

Another variant of the photostencil process is found in U.S. Pat. Nos. 3,510,303 and 3,507,654, which propose that certain advantages can be gained by the usage of a process in which a screen is placed in direct contact with a wet emulsion of a conventional kind. This is related to the direct and indirect photostencil techniques, but the light sensitivity and aging properties of the photosensitive materials still present the same problems, vacuum and printing frames are still proposed for use, and inordinately long drying times are still required. It should also be noted that it has been proposed by others, as in U.S. Pat. No. 3,730,715, to provide photographic images having continuous tone characteristics by using photopolymerizable materials, and to incorporate fillers in such materials for a broad range of generally specified purposes, and for the specific purpose of providing particular colors. Taken individually or together, all of these suggestions of known prior art do not reveal how a basic improvement in stencil screen processing, and in the stencil screens themselves, can be obtained.

Despite the many different investigations and efforts which have been undertaken toward the preparation of relief images using traditional photosensitizable layers and photopolymers, it is evident that in the present state of the art, the indirect, direct and direct/indirect methods of preparing photostencils are still predominantly used. The desirable objectives of increasing both the resolution and the durability of photostencils, while using a simpler and more reliable technique for preparing the screen and exposing the photosensitive layer, have not yet been satisfied by new materials and processes.

SUMMARY OF THE INVENTION

In accordance with the invention, superior photostencils are provided by an uncomplicated but versatile process which fully encapsulates the filaments of a screen with a controlled thickness of photopolymerizable material providing flat surface layers on both sides of the screen through successive coatings and exposures. The photostencil has minimum undercutting, giving excellent resolution and bridging properties, but the controlled thickness provides uniform ink deposit and the full encapsulation also provides better durability than has heretofore been achieved. Further, the photopolymer includes a minor but precise amount of radiation attenuating particulate and has a spreadable but self supporting consistency. The film master is directly adhered to and spatially positioned by the screen during normal handling, without the use of a vacuum frame or external support. The incorporated particulate limits but does not block radiation transmission and enables radiation exposure to be relatively short but nevertheless in a range having substantial latitude. Using a standard formulation for different screen mesh sizes, the thickness of the stencil image may be controlled by exposure times alone.

In a more specific example of a method in accordance with the invention, a photostencil is prepared by spreading a viscous photopolymer liquid through a screen against an underlying film master such that a flat surface layer is defined on the film side of the screen. The photopolymer is responsive to radiation in a limited portion of the ultraviolet region and may be used in normal artificial light. The film adheres to the photopolymer and screen in a fixed spatial relation and the layer is then exposed, through the film master, to a source of ultraviolet radiation for a short interval, hardening the exposed areas. The assembly is then recoated, on the side opposite the film master, with an excess thickness of the same photopolymer. The second coating is then exposed through the master to the ultraviolet source and chemically links to the first, providing a unitary structure that covers over the screen, providing complete encapsulation of the filaments. Furthermore, the depth of the curing and hardening is determined by the duration of the exposure, and is uniform throughout the area of the screen. Thus a flat surface also results on this second side of the photostencil, and the excess material is removed for reuse if desired. Subsequently, the film master is stripped off the stencil without damage. The unexposed areas are removed with a suitable solvent, by mechanical action or both, and the stencil is post cured to complete the cross-linking, leaving the final stencil image. The resolution is equal to that obtainable with indirect photostencils, but in excess of 50,000 copies have been made without deterioration of image quality, giving durability equal to the best results heretofore achieved with direct photostencils.

Photopolymerizable compositions in accordance with the invention have high solids content and little if any solvent, and have high responsiveness to ultraviolet radiation in the 360 to 380 nanometer region. In addition, they incorporate the light absorbing particulate, in significant but relatively minor proportion, such as less than 1% by weight of a carbon black of about 56 nanometers particle size. The particulate attenuates and distributes the impinging radiation, so as to extend the cure time substantially uniformly throughout the thickness of the stencil. The distributed particulate also tends to stabilize the polymer during its transition from the uncured to the cured state, providing extremely high resolution. It is thought that the presence of the light attenuating particulate inhibits the transport of free radical generated under light excitation during cure, providing a sharp interface between the exposed and unexposed regions. This system substantially increases the latitude of the system to exposure times, even though exposure times are still relatively short (e.g. of the order of 1-10 minutes). Further, although the minor amount of particulate does not fully block radiation, the depth of polymerization is controllably limited in accordance with exposure time. The photopolymer and particulate system enables preparation of stencils proper depth and that fully encapsulate the filaments of the fabric by using non-critical individual steps that can be varied to accommodate an extremely wide range of fabric sizes, filament materials and special requirements. High resolution stencils and extremely large size, low resolution stencils can be prepared with the same photopolymer system, which can also be used with metallic and metal-surfaced screens.

The material has an extremely long shelf life, has no toxic fume emanations, is not sensitive to ambient light, and the system may therefore be utilized with normal artificial lighting and in a closed environment. The resultant stencil is elastomeric in character, which contributes to its durability. By the incorporation of a selected range of high acid constituents, the screen may be reused many times through the application of an alkaline reactant which breaks down the stencil image. The reclaimable system is preferably used in a range of types which provide different photosensitivities and viscosities.

Materials for image reproduction in accordance with the invention may be characterized as high solids content light curable substances having a spreadable characteristics and low toxicity, incorporating a stabilizing and light attenuating particulate in minor amount and having limited adherence to photo masters of the class including polyesters and some acetates.

BRIEF DESCRIPTION OF THE DRAWINGS

A better understanding of the invention may be had by reference to the following description, taken in conjunction with the accompanying drawings, in which.

DETAILED DESCRIPTION

Figure 1:
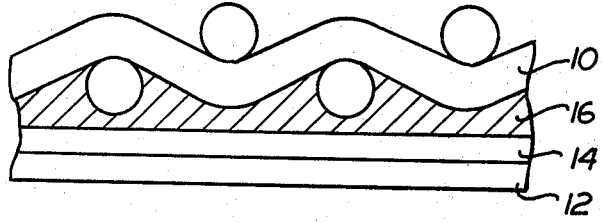
FIG. 1 is a side sectional view of a first coating step in a process for preparing a photostencil in accordance with the invention.

Methods of making photostencils in accordance with the invention utilize a photopolymerizable system that has essentially 100% solids content and high sensitivity to ultraviolet radiation, particularly in the 360 to 380 nanometer wavelength range. By 100% solids is meant that if solvents are used for thinning they are limited to no more than 10% by weight of the material, and typically substantially less than 5%, although usually no solvent is employed Radiation curable materials that may be used in accordance with the invention include monomers and oligomers and compounds that are curable in response to light, and preferably light energy within the ultraviolet portion of the radiation spectrum, and wavelengths of 360 to 380 nanometers are of particular interest. In the prior art, in contrast, the tendency has been to utilize sensitivity in a region closer to the visible light portion of the spectrum.

In view of toxicological considerations, it is preferred to utilize a mixture of an urethane acrylate oligomer essentially free of uncombined acrylate, and a reactive monomer. Although various ultraviolet polymerizable materials are known that can be employed for specific applications, a particularly suitable one is a mixture of urethane acrylate oligomer, such as "Uvimer 778" or "Uvimer 785", products of the Polychrome Corporation of New York, and a reactive monomer such as N-Vinyl-2-Pyrrolidone sold as "V-Pyrol RC" by G.A.F. Corporation. "Uvimer 778", for example, has a high viscosity characteristic, and is a clear liquid that is extremely stable even at ambient temperatures and thus has a long shelf life without degradation of its properties. It is of low toxicity and can be used in quantity in enclosed environments without adverse effects.

In most instances a substantial proportion (e.g. 20-40%) of the reactive diluent is incorporated (initially or by addition) into the radiation curable material for stability and handling properties. Where the curable material as supplied contains some proportion of a diluent, this factor must be taken into account in determining the total amount to be used. Vinylpyrrolidone is one example of a suitable diluent in the form of a reactive monomer although others will suggest themselves to those skilled in the art. The use of an acrylate diluent is recognized as feasible although the toxicity and handling problems must be recognized. The presence of a small percentage of solvent can assist in lowering the amount of diluent to be utilized.

The light curable material also comprises a minor proportion (typically 1-4% but less than 10%) of a sensitizer or photocuring agent, such as "Irgacure 651" of Ciba Geigy of New York or "DEAP" (diethoxyacetophenone) supplied by Union Carbide Corp. of New York. The former sensitizer is preferred because it is of low toxicity and has excellent properties. The photopolymer system is essentially free of volatiles and in the absence of any substantial amount of solvent presents no toxicity problems in a closed environment. The particular limited range of photosensitivity is significant, although other materials having sensitivity to other particular ranges might be used. The photopolymer can be applied under ambient light conditions, although direct sunlight is to be avoided. The presensitized photopolymer and the reactive diluent have extremely long shelf lives (at least 12 months) and do not require special handling, such as refrigeration.

The light curable material is used in what may be hereafter termed an "essentially solvent free" form, which is to be taken to mean that it contains only a minor proportion (less than 10%) of an evaporable solvent that may advantageously be added for limited or special applications to achieve particular handling characteristics. The addition of 5-10% of a solvent such as methyl ethyl ketone substantially lowers the viscosity of the material. The curable material may on the other hand contain the reactive diluent (or it may be added) in substantial proportion to lower viscosity but contribute to the high solids content. In any event, the proportion and type of evaporable solvent added cannot be such as to adversely affect the characteristics of the photographic transparency with which it is to be in contact. Usually the material is to have a viscosity in the range of 3000 to 10000 centipoise.

Moreover, the sensitivity to radiation is deliberately reduced by the incorporation of a quite precisely determined amount of light absorbing particulate, such as a carbon black having an average particle size of 56 nanometers, in an amount of less than 1% by weight. A suitable particulate is "Trial Black 2/0" sold by De Gussa Corp. The particulate not only provides coloration of the photopolymer, which enables the photostencil to be inspected and corrected much more readily, but also provides internal reflection and absorption of impinging radiation within the volume of the material. It has the effect of somewhat lengthening the exposure times, although they remain comparatively short, while substantially reducing the criticality of exposure time. Although the photopolymer appears opaque from a distance, visible light from a moderately strong source (e.g. a light table) can be seen through it. Used in this fashion, it appears that there is a change in the electromagnetic wave transmission property of the cured polymer that aids in control of polymerization of uncured material. Thus when radiation from a given source is maintained for a longer time interval, the radiation penetrates more deeply, but to a controlled depth which is quite precisely related to the exposure time. Although the phenomenon is not quite fully understood, the ability to control cure to a specific depth by variation of exposure time has been demonstrated conclusively. It is conjectured that a threshold exists at a certain depth and that photo-initiation does not occur at a greater depth unless there is a longer exposure. It is also conjectured that ultraviolet radiation transmitted through polymerized material is attenuated differently than through unpolymerized material, aiding the control of thickness.

The particulate also appears to function to control the stability of the polymeric material during cure. Dimensional stability is of critical importance to precise image reproduction. The polymeric materials can undergo a chemical reaction during light exposure which tends to cross the interfaces between exposed and unexposed regions, thus closing up fine lines which should be open. This dimensional change or interface shift is not wholly independent of the undercutting effect, which also acts to limit image reproduction quality. The use of a dimensional stabilizer such as a distributed particulate which acts to provide spatially distributed attenuation of the radiation, however, tends to limit both interface shift due to the spreading of the chemical reaction, and undercutting effects arising from unwanted light transmission. The normal shrinkage of the photopolymer upon cure is inhibited in stencils prepared in accordance with the invention. Even very large stencils have an immaterial amount of shrinkage, as can be determined by overlaying the film master against the finished stencil. It is also presently thought that the actual reactive mechanism involved in the undercutting effect is the transport of free radicals generated under light excitation into the unexposed regions, in which the cure reaction continues. This transport is thought to take place even where reflective and halation effects are minimized due to the optical properties of the screen. Although the presence of a light attenuator in distributed particulate form limits transmission of light energy and thus increases exposure time, it is also found that the tolerance in exposure time is substantially increased. A properly selected particulate can also concurrently act to enhance the flexibility, and thus the durability of the cured image.

Alternatively or concurrently an opacifier such as a dye which tints or colors the material may also act to limit undercutting effects. The presence of a color permits the material to be more readily inspected visually in a subsequent spreading and dispersal step, or during examination or retouching of the hardening image. Typically, less than approximately 2% is employed, and preferably the dye is in a concentration of only 0.5 to 1%. Suitable opacifiers, given by way of example only, are "Neozapon" green 3G dye, sold by BASF Wyandotte of New Jersey, "Normandy magenta 2400" red dye supplied by Paul Uhlich Co., "Orasol" blue GN dye of Ciba Geigy and "Orasol" brown GR of Ciba Geigy. The dye is thoroughly blended with the material in a suitable commercial mixer until color uniformity is achieved. The presence of the dye may somewhat slow the curing time, and although the effect is not substantial the proportion and type of dye used must be taken into account in the subsequent exposure. With ultraviolet sensitive materials it has been found that orange-red or red-pink dye has the least effect in increasing exposure time. Dyes are typically used in mixtures for making blockout borders around the stencil image, because they provide a good color contrast.

The photopolymer system chosen has chemical reactivity as well as viscosity and other physical properties which also contribute significantly to the process. The viscosity at ambient temperature (e.g. 26° Celsius) is typically in the range of 3000 to 10000 centipoise. The photopolymer as used is in a cohesive but spreadable state, such that it can be distributed by a spreader or blade upon a screen, to penetrate through as well as fill the openings of the screen, but when thus supported by the screen maintains its position and does not flow under normal handling. By normal handling is meant the shifts of screen position between the horizontal and vertical, and the normal transport of the screen within within a laboratory or a studio between work tables, light sources and other positions at which processing is to be undertaken. For coarse mesh screens, a higher viscosity material may be used to avoid any tendency to flow during handling. The photopolymer system also has the property of adhering firmly but releasably to a film master, which thereby is stably attached to one side of the screen. Various cleaning steps and release agents may be employed to insure that the film master does not adhere to other elements, such as a table or substrate, and is separable from the cured photopolymer material. With direct application of the film master to the impregnated screen, and adherence thereto during handling, there is an intimate juxtaposition of film to polymer layer that improves the quality of the reproduced stencil image. Precise maintenance of position of the film master is assured through a sequence of processing steps, and this is important because resolution is not lost. There is no need for a vacuum frame or comparable retention system.

General Example

The photopolymer system for permanent stencils requires no special preparation when taken in prepared form from a container. The system for reclaimable stencils is usually stored without the acid constituent until shortly before use, and has an acceptable but more limited shelf life when thus prepared. Mixing of the photopolymer is desirable, and normally aerates the material so that small bubbles can be seen under moderately high magnification (e.g. 50×) in a back-lit stencil. These are not voids but merely encapsulated bubbles that are substantially smaller than the openings of the screen. If desired such bubbles can be eliminated by use of a settling interval or a standard degasifier step such as passing the material through a fibrous bed while maintaining low pressure.

A screen of a given mesh size that is prestretched on a printing frame may be precleaned (e.g. by a degreasing solution) if necessary for application of the photopolymer. In the general case, it is preferred to use a standardized photopolymer-particulate system and to vary the exposure time so as to achieve the final properties desired for a particular screen. A single system for permanent stencils can be used for practically all fabrics, and a system of intermediate properties can be used to process the majority of fabrics which are to be reclaimable. At the opposite extremes of high resolution and large image and mesh size, however, systems of suitable varied viscosities are preferably employed. As is well known, finer mesh sizes are utilized for higher resolution images, and coarser screens are used for heavy ink deposits and less finely detailed reproductions. Mesh size is also generally related to fabric thickness, in the sense that as mesh size becomes smaller the fabric thickness also usually decreases. In accordance with the invention, the overall stencil thickness in proportion to fabric thickness is achieved by exposure control alone. Uniform layers of desired thickness can be achieved with little practice by employment of a squeegee or spreader edge. If a glass, metal or other flat substrate is to be employed, the presence of the distributed particulate enables an experienced operator to provide a uniform surface using a spreader edge or troweling effect. If greater precision is desired a blade held in a fixture so as to be swept across the substrate at a selected uniform spacing insures spreading of a desired consistent depth across the entire surface. Other means such as roll coaters, knife coaters and sheet spreading techniques may be similarly used.

Where a screen is to be used to receive the material, then the photographic transparency is generally placed on a flat surface under the screen, and the material is distributed over the top surface of the screen, through the apertures in the screen and into direct contact with the transparency. An advantageous technique is to first use an edge which forces the material into the mesh, and then a hard edge which levels off the top surface. Two coats of material may be applied, from opposite ends or from the same end, for better distribution.

The photographic transparency which is employed can have an effect on the reproduction process, because of different ultraviolet absorption properties. Both triacetate and polyester based films have been utilized with acceptable results, but it has been found that triacetate film is more transparent to ultraviolet radiation and thus provides shorter cure times. Some acetates, however, may be adherent to light curable materials and thus may be damaged on separation, so that care should be taken to use film bases that are not strongly adherent. When the material is fully cured, either type of transparency (usually a positive) may be manually stripped off without damage.

The nature of the surface across which the light curable material is distributed should also be taken into account. The polymeric materials disclosed act to surround the filaments of polyester and nylon screens to provide a unitary structure that has good durability even though there is no adhesion to polyester or nylon per se.

In the preparation of screen printing stencils the optical properties, as well as the mesh size, of the screen can affect the final result of the process. The dyes in the fabric filaments can absorb incident rays, reducing scattering, halation and undercutting. Fabric colors of yellow and orange hues are found to be superior for this reason, with an orange mesh providing least undercutting with available light sources. However, white fabric has also been used to provide superior results.

As seen in simplified form in FIG. 1, a pretensioned screen 10 is disposed above a flat reference surface 12, on which a film master 14 has been placed, and with the facing surfaces of the reference surface 12 and the film master 14 being cleaned or prepared so they will not adhere together. The mesh size used for screening is typically 16 to 508 strands per inch, with mesh openings of from 20 to 1180 microns and fabric thickness from 50 to 600 microns. A layer of photopolymer, containing light absorbing particulate as previously described, is then spread across the upper surface of the screen 10, and forced down through the screen into contact with the film master 14, to provide an underlayer 16 that is flush with the surface of the film master 14. By the use of a sufficiently hard spreading edge and constant pressure, the uniform underlayer 16 is provided without particular skill being required.

In this procedure, it is now convenient to inspect and correct the stencil underlayer 16, because the assembly can be held up to the light and imperfections or obstructions, including dust or dirt particles, loose threads and the like can be removed with the area affected being recoated and reexposed.

The screen 10, underlayer 16 and film master 14 are then exposed to a light source that is rich in the ultraviolet region of 360 to 380 nanometers wavelength range. The following light sources can be utilized effectively and are listed in the order of their efficiency in providing radiation in the desired wavelength range:

A. Metal halide polymer bulbs can be utilized effectively. Diazo bulbs can also be used.
B. Black light tubes in a direct exposure unit placed approximately $\frac{1}{4}''$ from the film master can also be utilized with slightly longer exposure times.
C. Strong carbon arc sources provide adequate radiation with longer exposure times.
D. Direct sunlight can also be utilized, but exposure is much more dependent upon particular light conditions at any specific time.

The exposure is effected through the film master 14 against the underlayer 16 using a nonreflective back surface. In typical examples this initial exposure will be in the range of 1 to 2 minutes, but depending on the screen and layer thickness, as well as the material, may be considerably longer. The underlayer 16 is cured until it is dry to the touch. The method of the invention permits this to be checked quite readily because a corner of the film master can be peeled back in a nonimage area to test whether the underlayer 16 remains wet or tacky, and the exposure time can be lengthened if needed. The result is a flat uniform surface on the underside of the screen 10, comparable to that provided with an indirect stencil. The first exposure hardens the first coat and provides good adherence to the screen so that subsequent steps can be carried out without increasing the depth of the underlayer or forcing it out of position.

Figure 2:
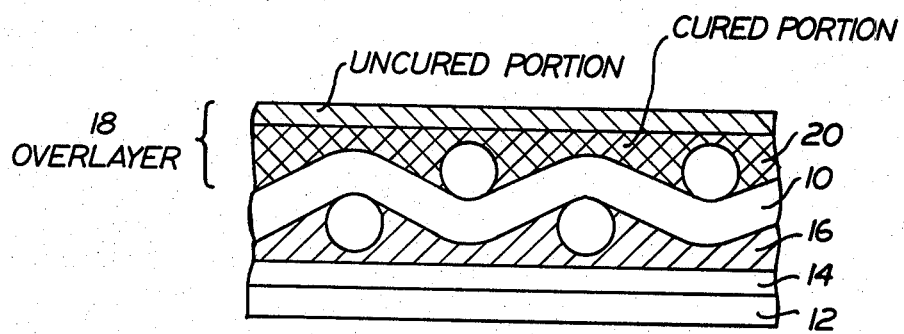
FIG. 2 is a side sectional view of a second coating step in a process for preparing a photostencil in accordance with the invention.

The screen with annexed underlayer 16 and film master 14 is then prepared for completion of the photostencil, by the application of an excess thickness of photopolymer on the side opposite the film master 14, in the form of an overlayer 18, as seen in FIG. 2. With the screen held at a slight angle (e.g. 15°), a bead of material disposed along one edge of the image area can be spread to an adequate thickness and the relative evenness and thickness can be visually checked by observing the relative opacity throughout the stencil area. An excess of material is desirable and only a small amount of practice is needed to insure that the coating thickness on the second side of the screen is adequate. The screen is once again returned to the light source unit, and is exposed again for about 2 to 3 times the initial exposure. Light penetration through the previously hardened layer and the region of the screen extends into the opposite side or overlayer 18, curing the overlayer to a uniform depth denoted by the cross-hatched area 20 in FIG. 2. This depth can be controlled relative to the thickness of the screen 10. For most applications, workers in the art will employ a total stencil thickness that is $\frac{1}{2}$ to $\frac{3}{4}$ mils greater than the thickness of the screen itself. However, for particular applications the thickness can be varied by exposure control alone, to a range of $\frac{1}{4}$ mil to 3 or 4 mils greater than the screen. The relative thickness controls the thickness of the deposit of ink or printed circuit or device material, a factor which can be of paramount importance in many applications. A fuller discussion of variation of exposure times under various conditions is provided below. The control of depth of cure, however, is uniform throughout the area of the image on the screen 10, and the unpolymerized portion of the overlayer 18 simply remains wet.

Following the second exposure, the film master 14 is stripped off from the stencil, and is cleaned with isopropyl alcohol or other solvent, to remove any adherent unexposed photopolymer. This leaves the film master undamaged and ready for reuse. The screen is placed on paper (e.g. newspaper) and the excess material on the second side (the wet portion of the overlayer 18) is scraped off with a soft squeegee and returned to a container for reuse. A majority of the uncured material in the openings is deposited on the paper. The residual uncured polymer in the open areas of the stencil may then be removed with "Cellosolve", an ethylene glycol ethyl ether, or other commercial solvent by brushing or wiping.

After drying, the photostencil is post cured to insure maximum durability, by virtue of establishing complete cross-linking. Post curing is effected by exposing the overlayer side to the light souce for a time approximately equal to the total of the prior exposures. Full curing throughout the layer is essential, to prevent washing out of interior material after exposure, and to provide firm self-anchoring of polymer around the screen filaments.

Figure 3:
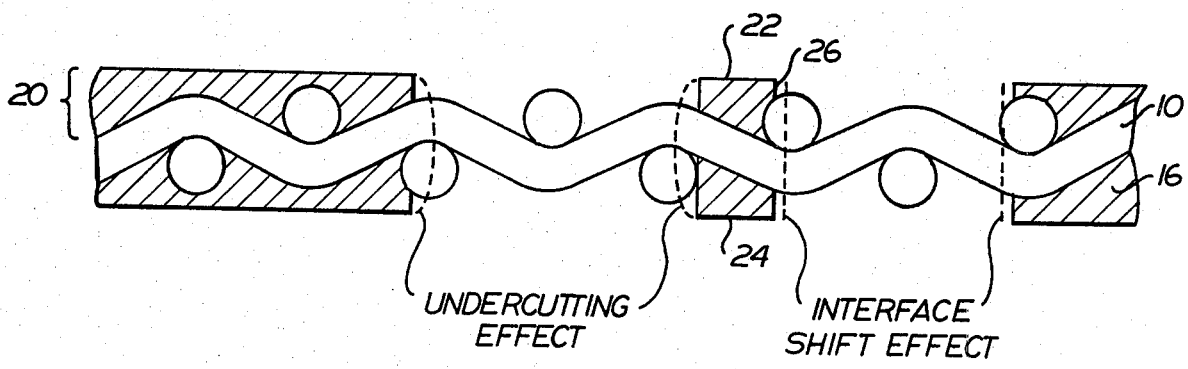
FIG. 3 is a side sectional view of a fragment of a photostencil prepared in accordance with the invention.

As depicted in FIG. 3, the result is a photostencil having a precisely defined image in three dimensions, and which completely encapsulates the filaments of the screen 10. It has been noted that the screen filaments do not strongly physically adhere to the stencil coating, particularly where the filaments are of synthetic resin. However, the coating does surround or envelop and form a self-binding layer about the filaments, so as to provide an integral structure which can have substantially greater life than existing screens in use. The physical properties of the stencil are enhanced because the coating is symmetrical relative to the screen, in contrast to the prior art, because the exposed hardened portions of the stencil image uniformly project from the opposite faces of the screen 10 to opposite flat broad surfaces 22, 24. The edges of the stencil have sharp shoulders 26, because the intimate contact between the film master and the stencil surface have eliminated any light diffusion that tends to occur when a spacing is introduced or an intervening glass is used. At the edges of the hardened portions an undercutting effect (shown in dotted lines in FIG. 3) would appear as peripheral cured portions in regions which were intended to be unexposed. Any undercutting tends to fill fine line apertures by enlarging the edges of a cured area, somewhat arcuately in cross section. In accordance with the invention, however, the undercut is limited to the order of 0.01 mm and has in a number of practical examples become indiscernible. Qualitative measurement of the undercut effect is not an established procedure, but close estimates can be made based upon fine line resolution. The standard of measurement employed here is to compare fine lines of known width (e.g. 0.1 mm) in a reference positive, under magnification, to the same lines and to pattern edges in the reproduced image. Such comparisons provide an objective measurement of whether the undercutting is, for example, less than 0.01 mm.

Figure 4:
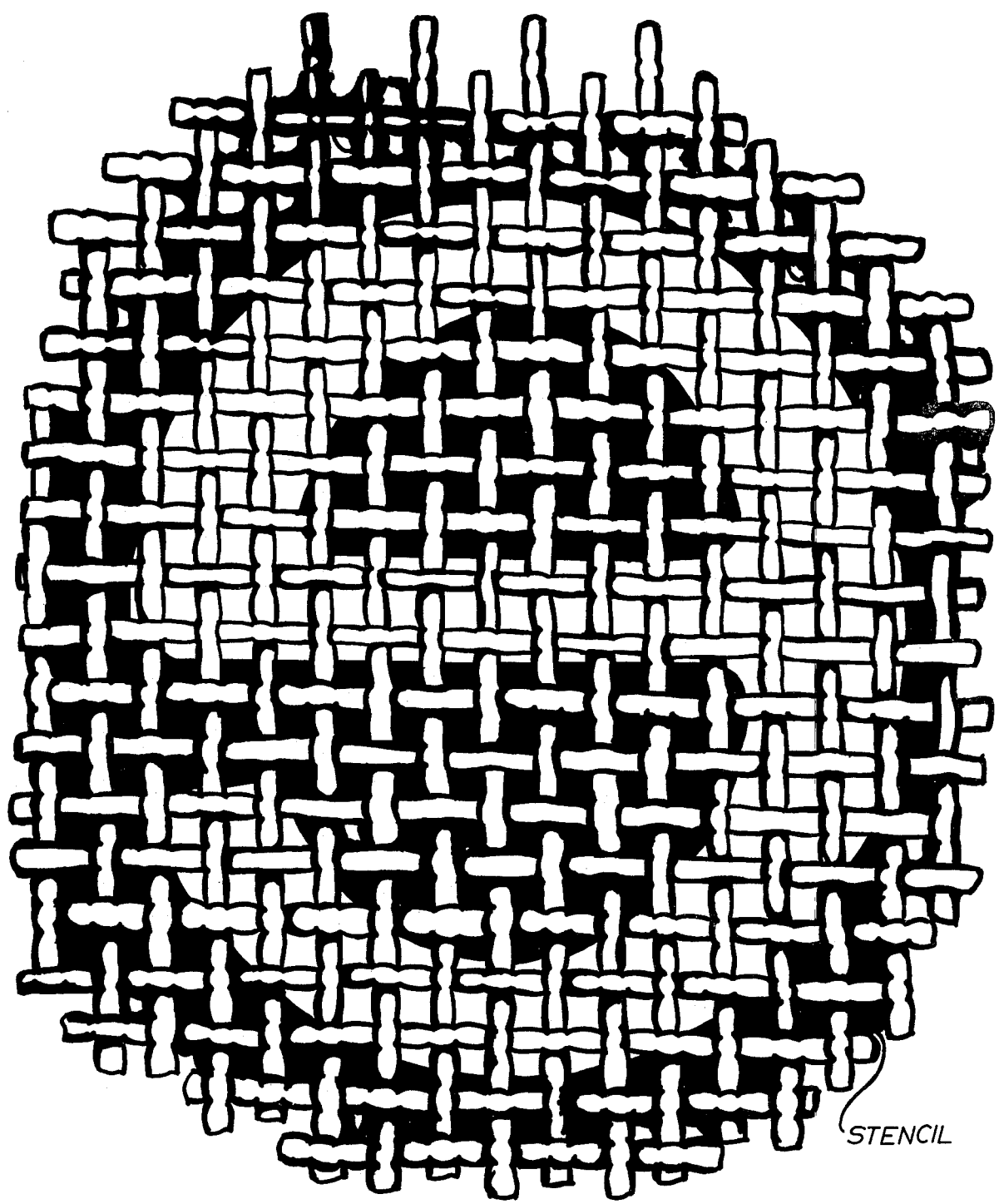
FIG. 4 is a direct copy of a portion of a photomicrograph, at 500 X magnification, of a small portion of screen having a stencil image prepared in accordance with the invention and demonstrating the bridging characteristics and freedom from sawtooth.

The significance of good bridging properties obtained through practice of the invention may be seen when considering FIG. 4. In this Figure there is depicted the enlarged (500×) image of a relatively fine mesh screen (e.g. >250 mesh) on which has been formed the image of a sharp curvature (e.g. a portion of a small "e"). The reproduction is on a 1:1 basis, and no changes have been made except that the encapsulated filaments in the stencil areas have been shown more clearly to contrast with the edges of the stencil images. The vertical and horizontal monofilaments define the small interstices of mesh, and the cured image region fills the interstices except where the line of the image edge intersects such an opening. In accordance with the invention images can be produced which, as shown, provide a bridge across the interstices of the mesh independently of the position and angle of the image edge relative to the monofilament edges at each aperture, thus forming a continuous smooth curvature. In the prior art, there is a much greater tendency for the image edge to follow the monofilament lines, particularly at small angles of divergence, so that a zig-zag or sawtooth effect is introduced in the image periphery. For example, the lateral midline of the "e" is at a small angle to the lateral filaments of the fabric, but no sawtooth effect can be found. As is evident from FIG. 4, lines of 0.1 mm (4 mil) resolution can be reproduced without difficulty, and the undercutting effect is minimal, ranging from indiscernible to 0.01 mm. Despite this precision, the stencils have a durability equal to the best of the direct stencils of the prior art. In excess of 50,000 copies have been made without loss of fidelity in the reproduced images.

Figure 5A:
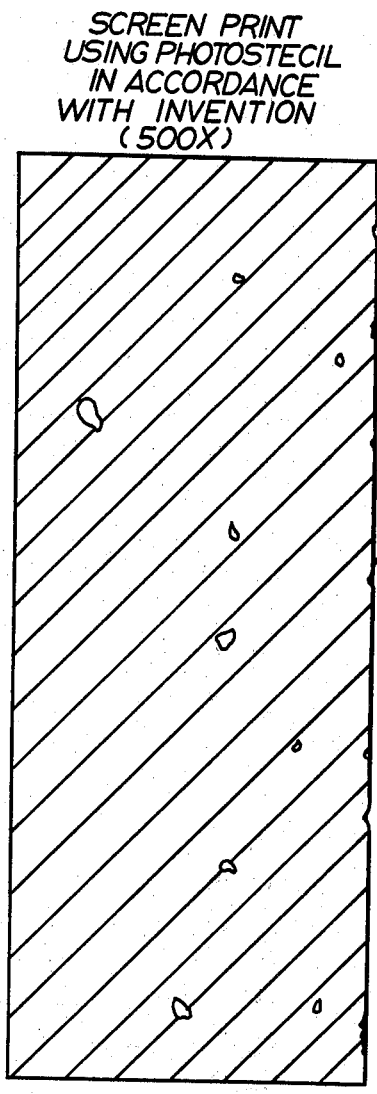
FIGS. 5A and 5B are direct copies of a portion of a photomicrograph of a part of a screen print made using a photostencil in accordance with the invention in comparison to a portion of a screen print made using a conventional diazo stencil, both after 8,000 prints, at 500 X magnification.
Figure 5B:
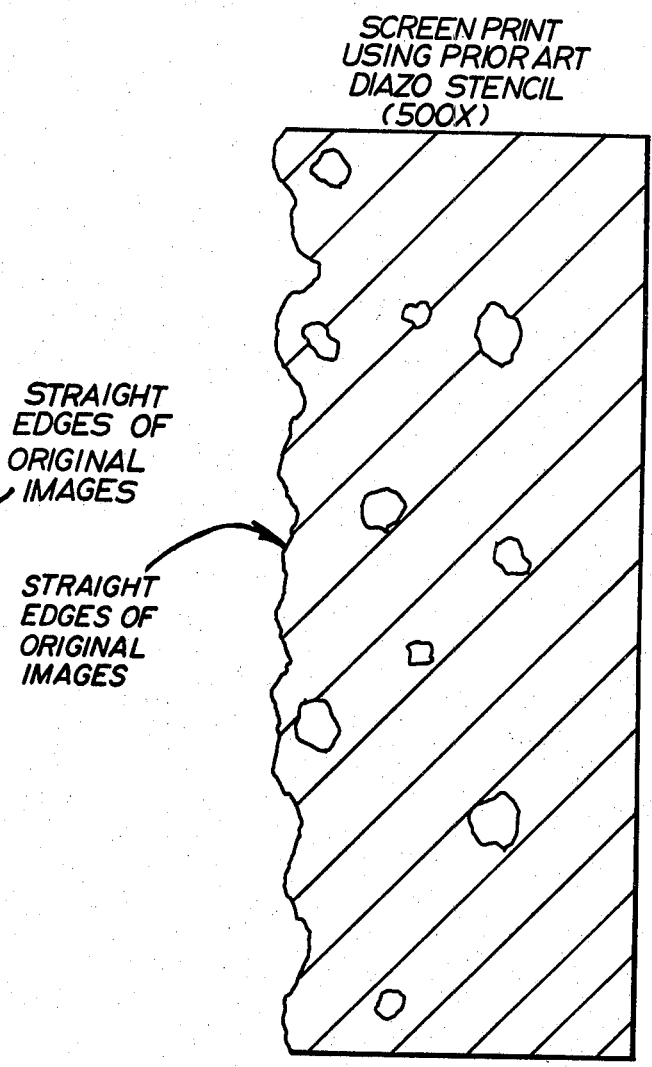

FIG. 5 is a 1:1 reproduction of a photomicrograph at an enlagement of 500×, of a part of a screen print (FIG. 5A) made from a stencil in accordance after 8,000 copies, in contrast to a part of a print (FIG. 5B) made from a diazo direct emulsion screen stencil after a like number of copies. Both stencils are on 355 mesh fabric. The small open areas represent voids in the printing ink, and the facing edges of the image of FIGS. 5A and 5B represent straight lines in the film master (and the original stencils) prior to use. It is readily apparent that the print from a stencil in accordance with the invention has preserved line edge quality while the prior art stencil has significantly degraded. This is due to the full encapsulation of the filaments and the precise, square-shouldered, edges on the stencils, as well as the durable and elastomeric character of the material itself.

It can be seen that the only substantial capital expenditure required for a system in accordance with the invention is that for the ultraviolet light source, which may require merely changing the bulb used in an existing light source system. The reference table, frame and spreaders are conventional tools in the photostencil industry, although particular adaptations may be utilized to best advantage in preparing stencils in accordance with the invention. The total time required for processing is substantially less than for prior art systems. Pinholes or voids can be touched up prior to the first exposure by examination of the coating against the light. The borders of the image can be blocked out using the photopolymer material, partially diluted with a solvent if desired, prior to the final exposure or the post curing step. This is also advantageously done using a different colored dye or particulate, preferably without a tendency for the color to bleed into the stencil area. At this time also, the stencil can be inspected and touched up with the original photopolymer material or with the blockout. All such preparatory and finishing steps require only a relatively short period of time, and the only drying step is that involved in eliminating residual solvent prior to post cure so that the image area can be cleaned and examined for complete elimination of unexposed photopolymer prior to post cure.

A wide range of synthetic, natural and metal screens may be employed in making photostencils in accordance with the invention. The screens may be woven of monofilament or multifilament. The major variable is in the thickness of the screen, which as noted above is related to the fineness of the mesh. A secondary variable is the light transmitting or reflecting property of the screen, because this can have an effect upon light dispersion from exposed areas into unexposed areas of the image, with a consequent effect upon the image quality. Yellow and orange screens are best used to make extremely high resolution images, but require exposure to a strong ultraviolet source. However, good bridging characteristics and freedom from sawtooth effects are maintained under practically all conditions. It is important to note that adhesion to the fibers themselves, in the sense of a strong mechanical connection or molecular bond, is neither required nor established for the great majority of filaments. The mechanical integrity of the stencil is maintained while making multiple copies, by virtue of the encapsulation, and not from a chemical or mechanical bond.

In this connection it should be noted that imperfections in the screen, or insufficient stretching of the screen in accordance with manufacturer's directions, preclude adequate registration of the stencil relative to the screen and reduce the useful life of the stencil. However, unsupported stencils can be and have been made to specialized purposes (small numerical and logo stencils used for identification by an electrolytic process) without problems. In this situation the registration and durability needed for graphic work is not required. Such results and uses cannot be effected by prior art systems.

Figure 6:
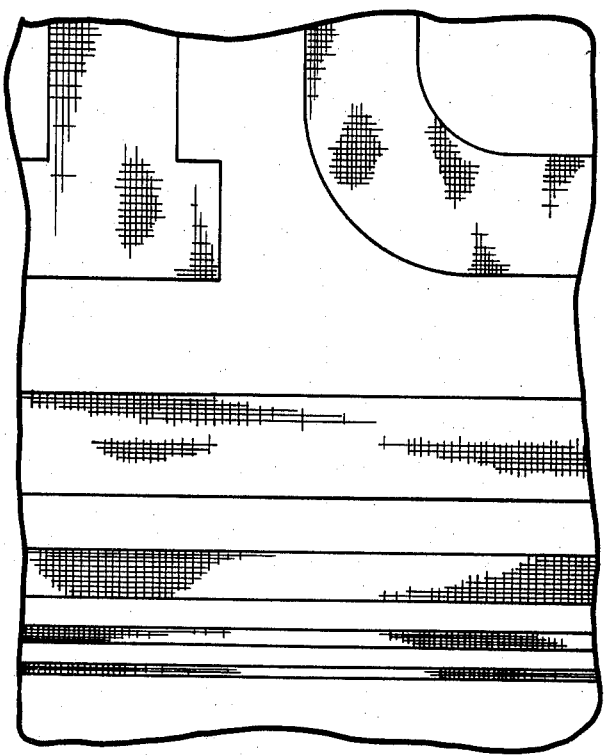
FIGS. 6, 7 and 8 are direct copies of photomicrographs, taken at 20 X magnification, of different stencil patterns prepared on different fabrics in accordance with the invention.
Figure 7:
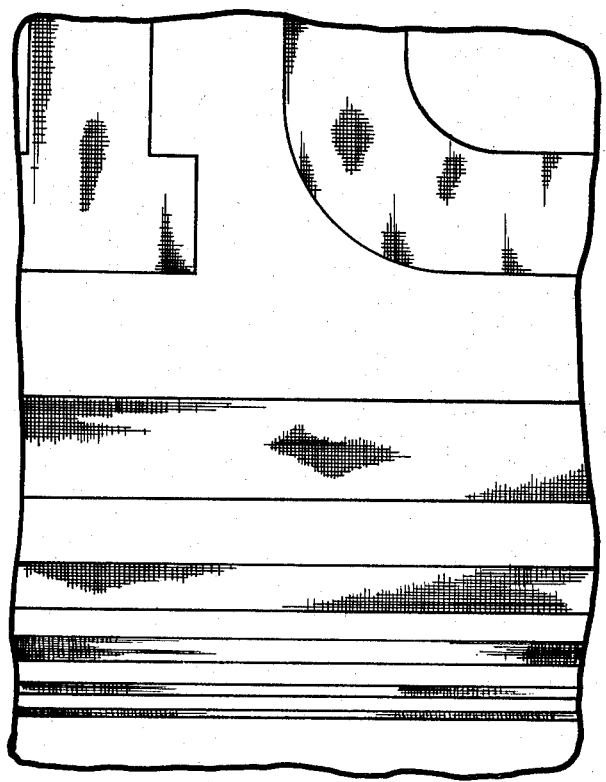
Figure 8:
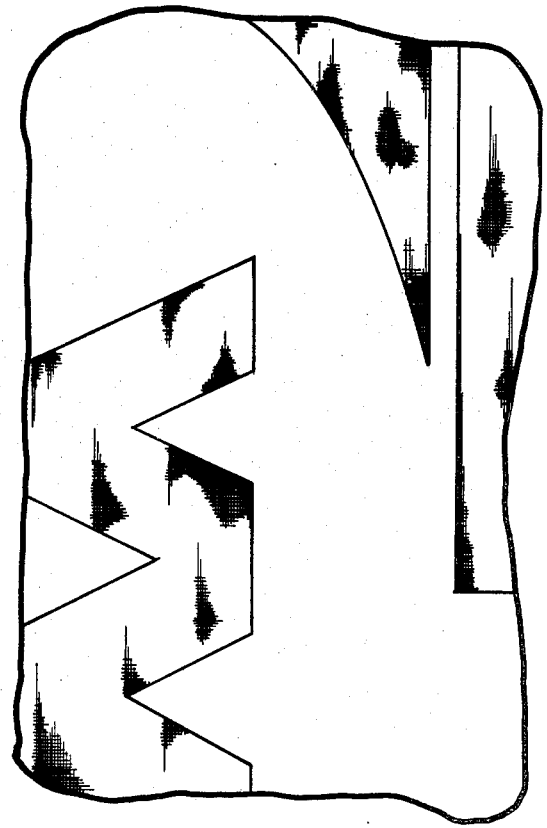

FIGS. 6, 7 and 8 are 1:1 reproductions of photomicrographs, taken at 20×, of stencils prepared in accordance with the invention. FIG. 6 is a portion of the stencil on an 86 mesh fabric while FIG. 7 is a portion of the same image on a 280 mesh fabric. Both exhibit excellent bridging and freedom from sawtoothing. However, the bottom line on FIG. 7 is very thin (1 mil wide) and this part of the image cannot be retained on the coarser 86 mesh fabric. FIG. 8 represents a portion of a different image having similar quality on a 200 mesh screen. Dot test patterns on stencils in accordance with the invention approximate the ideal circular outline of the master pattern even when the radius of curvature is extremely small. The dots can approximate the size of the apertures in the mesh, but will be firmly adhered to the screen if anchored to both sides of at least two filaments in each direction. This objective is met because the precisely registered and chemically coupled small polymer dot masses encapsulate the screen filaments to the full extent permissible by the dot areas. The reproductions evidence the fact that the side walls or shoulders which define the stencil margins are substantially perpendicular to the broad surfaces, providing a sharp juncture to define the limit of ink flow.

The freedom from a strong mechanical bond, however, is extremely advantageous in terms of the ability to reclaim a screen for usage in making another stencil. As described in the detailed examples given below, a variation of the photopolymer material can be utilized to recover the screen. In this variation, a substantial amount of an acidic constituent is employed on the photopolymer material. In a preferred example, the material incorporated 21.4% by weight of an ethylenically modified carboxylated monomer, specifically "Polychrome 485". After preparation of the stencil, and use for making a desired number of copies, an alkaline solution or paste may be spread on both sides of the stencil to initiate the break down of the stencil material, without attacking the filaments themselves. After an adequate reaction time (e.g. 30-40 minutes), the screen may be cleaned with a water spray. However, some filaments, particularly those of natural origin and certain types of metals, are attacked by alkaline materials, and are not suitable for use in a reclaimable screen structure. Usage in paste form enables the operator to clean the screen without chemical attack on the frame or other parts of the system.

The reclaimable system also differs in that a single formulation does not provide a reasonable range of total exposure times for all of the wide range of screen finenesses and stencil resolutions that may be desired. Accordingly, the incorporated particulate is varied over a range, but still held below about 1%, to give substantially different characteristics in the reclaimable system so that exposure times are neither too long or too short under varying conditions. What may be termed a "standard" reclaimable formulation includes about 0.45% of particulate and can be used throughout the broad middle range of mesh and image sizes, and including moderately coarse to fine meshes. The incorporation of the greatest amount of particulate (e.g. 0.68%) provides a material that can be utilized with extremely small meshes to provide precision images, but preferably should be utilized with a strong light source. The incorporation of the least amount of particulate (e.g. 0.10%) enables stencils to be prepared, using most available light sources, on relatively coarse fabrics.

It is known that cure time can be reduced by maintaining the light curable material in an inert atmosphere during exposure. However, methods in accordance with the invention already provide convenient, non-critical exposure times, and a further reduction in exposure time will be useful only in exceptional cases.

An important advantage of systems and methods in accordance with the invention is that they can be used with both water and solvent based inks. Modern pollution control requirements are increasingly restricting the amounts of solvent that can be used in a facility, as well as restricting the usage of solvent based inks themselves. Available systems typically at best water resistant, not water proof, require usage of vacuum frames, have limited shelf life, sensitivity to ambient light and require careful and extensive processing steps, such as multiple drying, coating and washing steps. In contrast, the present invention provides a basically new, simpler and far more versatile technique for stencil preparation.

Further variations and modifications in accordance with the invention are described in the following detailed examples:

EXAMPLE I

Figure 9:
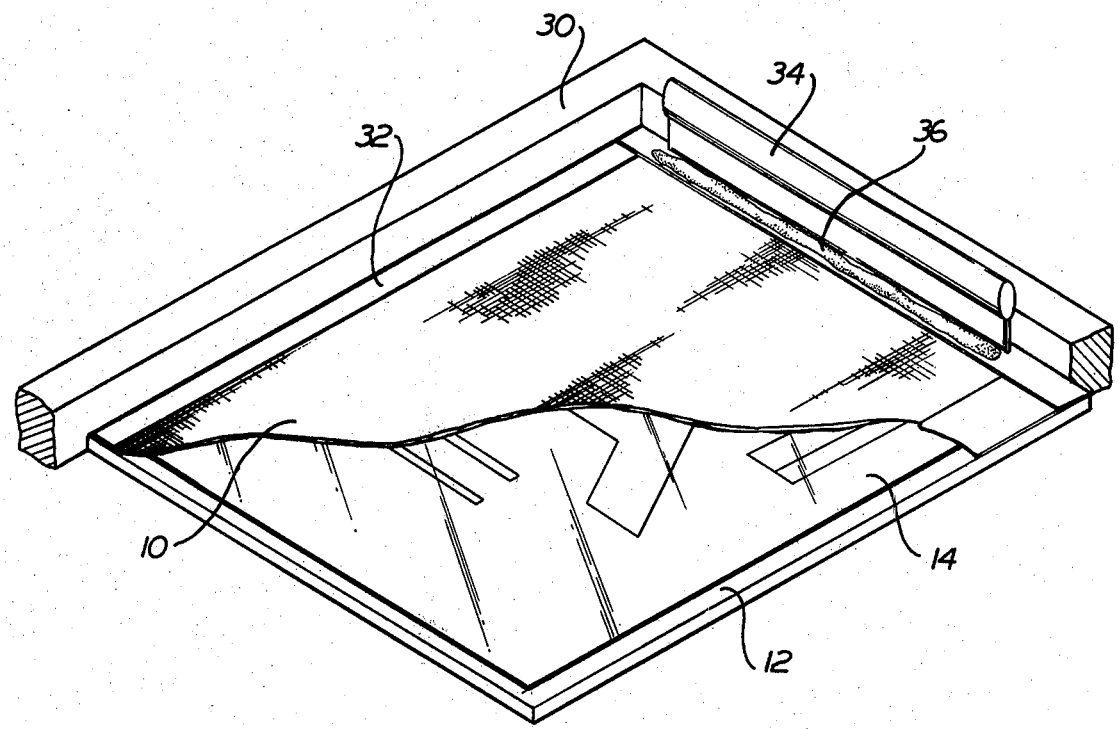
FIG. 9 is a perspective view, partially broken away, of a system used in making a photostencil in accordance with the invention.

A test image having line, pattern, print type and pictorial representations was reproduced as a photostencil on a 280 mesh screen of polyester filaments, starting with pretensioned scren 10, in a frame 30, as shown in FIG. 9. A reference surface 12 slightly smaller than the inside dimensions of the frame 30 and approximately $\frac{1}{8}''$ in height was wiped clean and sprayed with an antistatic material to avoid cohesion between the reference surface and a superimposed film master 14, disposed emulsion side up on the reference surface 12. The emulsion side of the film master 14 was also wiped with an antistatic material, and both the screen 10 and the emulsion surface of the film master 14 were wiped with a polonium static eliminating brush to remove dust particles. The screen frame 30 was then placed about the reference surface 12, with the mesh 10 in direct contact with the film master, as depicted in FIG. 9. The stencil area was defined by marginal application of masking tape 32 about each side of the frame, to a point slightly inside the edge of the film master without blocking out any of the image.

In subdued light, a bead of thoroughly stirred photopolymerizable material 34 was disposed along one edge of the mesh 10 in preparation for coating. A squeegee 36 longer than the transverse dimension of the bead of photopolymer 34 was then spread across the mesh 10 in a first direction, using firm pressure comparable to that used in making a screen print. The squeegee 36 had a hard edge, to force the photopolymer 34 down through the screen 10 and into contact with the film master 14. A second pass with squeegee 36 is made using less pressure to fill the openings with photopolymer 34 and the excess was removed with a spatula. The image area was then examined under a light for pinholes and voids, and these, when found, can be filled by the application of small amounts of photopolymer forced down through the screen 10 with a small plastic coater.

The frame, containing an impregnated underlayer of photopolymer 34 and the adherent film master 14, was then placed in a light exposure system including a high source rich in the 360 to 380 nanometer ultraviolet region, the light source being black light bulbs of 40 watts at a distance of $\frac{1}{4}''$. With the 280 mesh screen specified, the exposure was for 1 minute, causing the photopolymer 34 to harden in accordance with the exposure image defined by the film master 14.

An overlayer of photopolymer was then applied by laying down a bead of material along one edge of the taped area, with the screen 10 raised at a slight angle to the horizontal (e.g. 15°) and using a metal applicator to spread the photopolymer evenly across the screen, leaving a heavy glossy coating. The coating was checked visually to ascertain that it was almost fully opaque and of even shade, indicating that it was more than adequate to cover that side of the screen 10, with sufficiently excess material to insure that all of the filaments are fully covered and will be encapsulated upon exposure.

The screen 10 was again exposed, through the film master side, to the same light source for 2 minutes, fully curing the overlayer to a depth sufficient to fully encapsulate the filaments of the screen. This leaves the exposed surface of the overlayer wet or tacky, depending upon the thickness of the overlayer at particular points. However, the underlayer and overlayer are in firm union and are chemically bonded through the crosslinking of the exposed areas. The excess, uncured top surface of the overlayer was scraped off with a squeegee and placed in a container for later use.

The film master 14 was then stripped away and wiped with isopropyl alcohol soaked tissue to remove any adherent uncured photopolymer. The open areas of the stencil were then cleaned with "Cellosolve" by dipping a brush in the solvent and brushing the areas open, followed by wiping the stencil with a paper tissue until the open areas are clean.

The screen was then dried, inspected for pinholes and voids, which were retouched with the photopolymer, and the margin was blocked and post cured by exposing to the light source for an additional 5 minutes. The resultant stencil image was flat on both sides, had a resolution of better than 0.1 mm with no visible undercutting. While this test image was not subjected to life testing, other stencils on 280 mesh have been reproduced for in excess of 50,000 copies without degradation of image quality.

EXAMPLE II

The following example also demonstrates that the cure may be interrupted for application of further light curable material. During the interruption, the cure may be checked prior to adding new material or without adding new material.

A screen was prepared by placing a positive transparency emulsion side up against a glass backing.

The positive was then covered with a prestretched, degreased polyester printing screen of 305 mesh.

A light curable material was prepared by mixing 65 grams of Polychrome "UR-2279", 35 grams of Vinylpyrrolidone and 4 grams of "Irgacure 651" in a commercial mixer, limiting the temperature to below 100° F.

The photoreactive material was squeegeed through the mesh, adhering the positive to the adjacent face of the mesh.

The screen was then exposed, through the positive, to a high intensity 5000 watt UV light source for 3 minutes at 48".

A second coat of the material was squeegeed over the partially cured first coat.

The screen was reexposed for 3 minutes until a complete cure was obtained.

The positive was stripped from the cured stencil material and washed clean with methyl ethyl ketone.

The screen was immersed in "Cellosolve" solvent to clean the unexposed areas and then rinsed in water preparatory to final use.

The edges of the stencil had an undercutting of less than 0.01 mm.

EXAMPLE III

Excellent resolution was obtained using a dimensional stabilizer in the mix, as follows:

A light curable material incorporating a light attenuating distributed particulate was prepared using:

| | |
|---|---|
| 99.5% { | 65g "UR-2279" of Polychrome Corp. |
| | 35g Vinylpyrrolidone |
| | 4g "Irgacure 651" |
| 0.5% | De Gussa "Special Black #4" particulate |

The particulate is a carbon black that was ground on a 3 roll mill prior to being mixed into the light curable material in a high speed stirrer. The mixture was applied to a 280 yellow mesh screen and exposed for 10 minutes at 48" to a Berkey 5 Kw polymer lamp.

Examination showed the resultant product had excellent detail, including reproduction of 0.1 mm lines, and no discernible undercutting. The bridging properties were also excellent, and comparable to those depicted in the reproduction of a photomicrograph of FIG. 4. Dimensional stabilization was clearly evidenced in this Example, when compared to other high quality stencils. Referring to FIG. 3, the distributed particulate has a decisive effect in preventing shift of the interface plane from its nominal position at the edge of the clear film region into the unexposed region under the black film region. This interface shift or dimensional instability can be seen under high power microscopic examination as a distinct narrowing of very fine lines, but without the arcuate bulge characteristic of undercutting. However, in the present Example and in other tests made with distributed particulates no such interface shift is discernible. Thus the stencil image has remarkably good fidelity to the positive image, and this is evidenced by stencils demonstrably superior in resolution to any heretofore known to be obtained by direct techniques. Screens prepared in this manner have made in excess of 16,000 prints without degradation of print quality. In contrast direct emulsions produced by prior art techniques usually break down at 4,000 to 5,000 prints and are incapable of providing comparable resolution.

EXAMPLE IV

Satisfactory results, although as not comparable quality to other Examples, were obtained using other light curable materials.

A screen was prepared as described in Example II except for using "Dynacure" GA72 vinyl base material of Thiokol Dynachem of Tustin, Calif.

This material was coated against a screen with underlying positive with the double coat technique of Example V hereafter on 305 mesh "Redi Ester" screen. The screen was exposed with a Berkey light source with polymer bulb for 15 minutes at 48". The resultant product had 0.2 mm definition.

EXAMPLE V

Although numerous variations of individual parameters and materials are disclosed herein and will suggest themselves to those skilled in the art, the precautions and procedures observed in the following example aid in consistent usage of the principles of the invention to best advantage.

(a) "Redi Ester" mesh (yellow above 200, white below) is stretched and degreased using Tri Sodium Phosphate.

(b) The screen is dried and placed on top of the positive (held in close contact) emulsion side up.

(c) The screen is coated twice with the light curable material of Example II with 2% of Polychrome 137 RD-2 red dye. The coating is applied once with a medium squeegee blade, then a back coating is applied using a metal blade.

(d) The screen is placed against a matte black background and exposed using a Berkey Addalux 5 Kw lamp with polymer lamp (exposure based on distance, e.g., 6 min. at 48").

(e) After exposure the positive is stripped away and washed with methyl ethyl ketone. The screen is immersed in "Cellosolve" and washed using a brush.

(f) The screen is rinsed with water and paper tape is applied to the edges along the frame then dried.

(g) A blockout based on the above light curable material with the addition of 5% methyl ethyl ketone is coated in the necessary areas making sure to cover the edges of the tape.

(h) Touch up of any thin areas may be manually accomplished using the above light curable material cut with 10% to 20% methyl ethyl ketone.

(k) The screen is post-exposed to insure final cure on both sides.

Reclaimable stencils—Examples VI to VIII hereafter set forth specific process conditions for the preparation of reclaimable stencils (i.e., screens from which the stencils can be removed so that the screen can be re-used). The coating, exposure cleaning and postcuring steps may be as generally set forth in Example I above, although the exposure time and the formulation used are both varied.

EXAMPLE VI

The "standard" reclaimable formulation, covering most of the commonly used mesh sizes and fabric thicknesses, may employ the formulation of Example I but incorporating 21.4% by weight of "Polychromic 445" (acidic constituent) and 0.45% by weight of the particulate. This may be used as follows:

1. 200 mesh for 1 min. first exposure, followed by a 3 min. second exposure
2. 280 mesh for 1 min. first exposure, followed by a 2 min. second exposure Following usage, the stencil image is removed by immersion in an alkaline paste solution of 12½% caustic soda for 40 minutes, and then washing in water.

EXAMPLE VII

Usage of a heavy gauge screen material typically involves lengthy exposure because of the need for radiation penetration throughout the heavy layer of coating. However, the exposure time is rendered much shorter by employing a photopolymer system as in Example VI, but with 0.10% by weight of particulate and a viscosity adjusted to the high end of the range (e.g. 8–10000 centipoise).

In a specific example a 6×× multifilament polyester was coated with the formulation on the underlayer side and exposed to a 5 Kw light source at 48" for 45 seconds, then coated on the overlayer side and exposed for 3 minutes, followed by cleaning and postcuring for 4 minutes. The resolution achieved was slightly diminshed from the other examples, but was nonetheless excellent for the capabilities of a coarse mesh.

Other coarse meshes, such as 8×× multifilament, can be used with generally comparable exposure times. For glitter meshes 16T, 25T and 33T of nylon or polyester, the first exposure is of 3 to 4 minutes and the second exposure is of 12 to 15 minutes.

EXAMPLE VIII

With a reclaimable system, using 0.68% particulate, extremely high resolution and fine detail can be achieved using fine mesh sizes (e.g. 355 mesh). The light source should however be strong in the 360 to 380 nanometer region.

Some examples of usage of this precision material are:
1. 355 mesh for 1 min. first exposure and 3 min. second exposure
2. 305 mesh for 1 min. first exposure and 3 min. second exposure

EXAMPLE IX

The materials used for processing metal mesh are the same as for synthetic fabrics, but because of the non-absorption of light, the processing techniques are different. The following example is for preparing a reclaimable screen of metal mesh. Metalized polyester mesh, which has a nickel coating, cannot be used because of alkali attack on the nickel. Because the screen only reflects radiation, cure of a second coat or overlayer will not properly be effected, so that a single coat is used.

1. A metal screen mesh is thoroughly degreased and dried prior to coating.
2. It is insured that the mesh is not kinked or curled, and that it remains absolutely flat on the build up board during and after coating.
3. The handling sequence may then proceed as follows:
   a. The positive is prepared by brushing with a cleaning preparation.
   b. Both sides of the mesh are dusted with static removing brush (or air blow).
   c. The frame is placed in position and the area to be coated is masked off.
   d. Using a sharp medium squeegee the screen is coated once up firmly and once back lightly with the reclaimable material having 0.10% particulate.
   e. Excess material is removed and the material is exposed 5 to 6 minutes using 5 Kw at 48" or a blacklight unit.
   f. The tape is removed and the positive is peeled off.
   g. The inside of the screen is brushed with Cellosolve onto newsprint or newspaper until the image area appears clean.
   h. Air is blown through the screen to dry off the solvent.
   i. The image is inspected to see that all unexposed area is open—if not, the area is brushed again with clean solvent.
   j. The positive is cleaned with isopropyl alcohol.
   k. The screen is touched up and borders are blocked out.
   l. The image is post cured for 5 to 6 minutes on the inside of screen by exposure to the light source.
4. For positives with slight kinks or dings caused by finger nail marks, etc., a coating process as for synthetics may be used described in Example X below.

EXAMPLE X

Previously it has only been possible to make paste ups (assembled art work) where the design has no fine detail. By using a thin sheet on which different positives may be assembled in the desired geometry, and by employing the following sequence, superior results can be achieved.

1. A piece of 1 mil polyester film smaller than the inside of the screen, is placed on a piece of newprint, about the same size, which is on the build up board.
2. The polyester is cleaned with a preparatory solution and a clean screen is placed on top of it.
3. The photopolymer material of Example I is squeegeed through the mesh onto the 1 mil polyester as with a regular positive. This adheres the polyester to the material and holds it in place on the screen.
4. The back of the polyester sheet, or the cut film masters, is sprayed with spray mount adhesive in preparation for affixation.
5. The screen is inverted and the positives are set in position on the polyester film. The positives are burnished gently to ensure good contact.
6. The positives are exposed to the light source and the process is continued through addition of an overlayer and a second exposure, as in Example I. After the exposures are complete, the composite can be peeled off, cleaned with alcohol, and stored or the film can be cut and the pieces filed. Alternatively the positive can be stripped from the film and cleaned with alcohol to remove the adhesive.

For very fine detail, dyed fabric should be used. For hand cut masking film, the polyester film can be left on to avoid pulling the masking material away from its support sheet. For close register work using multiple positive layouts, such as decals, very fine detail can be achieved providing the positives are mounted emulsion side up against the 1 mil sheet.

Using this method has several advantages:
1. It eliminates tape and a carrier sheet for the paste ups except for close register work as above.
2. The coating is on a perfectly smooth surface so the condition of paste ups (defects such as dings and small kinks) are not critical.
3. The thin polyester interposed between the film and the photopolymer minimizes light diffusion and preserves detail.
4. Screens can be coated ahead of time and kept in a dark storage area.
5. Masking film can be cut right-reading without damage by chemicals as it is protected by the 1 mil polyester sheet.

Exposure Control and Variations—Tables I and II below depict the approximate exposure times used for a wide range of conventional screen fabrics, including both monofilament (Table I) and multifilament (Table II). The exposure times given all relate to the successive coating technique with exposure duration control to achieve full encapsulation of the filaments. The test exposures were made with 40 W black light tubes at ¼", but similar relative results were obtained using metal halide, carbon arc and direct sunlight as the light source. The results evidence the fact that it is now possible to use primarily only one permanent or reclaimable system to provide results of superior quality for the substantial majority of fabrics that might be used. Furthermore only a few variations of the basic system are required to provide comparable results with fabrics approaching the extreme limits of coarseness or fineness.

TABLE I

MESH COUNT MONOFILAMENT POLYESTER

| TYPE OF SYSTEM USED | | 355W* | 355Y | 305W | 305Y | 280W | 280Y | 255W | 230W |
|---|---|---|---|---|---|---|---|---|---|
| | | (Numbers indicate strands per inch) | | | | | | | |
| RECLAIMABLE PRECISION | FIRST EXPOSURE | 1 min. | 1 min. | 1 min. | 1 min. | 1 min. | 1 min. | 1 min. | — |
| | SECOND EXPOSURE | 2-3 min. | 2-4 min. | 1-4 min. | 2-4 min. | 2-3 min. | 2-4 min. | 2-4 min. | — |
| RECLAIMABLE REGULAR PERMANENT | FIRST EXPOSURE | 1 min. | — | 1 min. | — | 1 min. | 1 min. | 1 min. | 1 min. |
| | SECOND EXPOSURE | 1-2 min. | — | 1-2 min. | — | 1-2 min. | 1-3 min. | 1-2 min. | 1-2 min. |
| RECLAIMABLE FAST | FIRST EXPOSURE | — | — | — | — | — | — | — | — |
| | SECOND EXPOSURE | — | — | — | — | — | — | — | — |

| TYPE OF SYSTEM USED | | 230Y | 200W | 157W | 109W | 86W | 16T-W |
|---|---|---|---|---|---|---|---|
| | | (Numbers indicate strands per inch) | | | | | |
| RECLAIMABLE PRECISION | FIRST EXPOSURE | — | — | — | — | — | — |
| | SECOND EXPOSURE | — | — | — | — | — | — |
| RECLAIMABLE REGULAR PERMANENT | FIRST EXPOSURE | 1 min. | 1 min. | 1 min. | — | — | — |
| | SECOND EXPOSURE | 2-4 min. | 2-4 min. | 2-4 min. | — | — | — |
| RECLAIMABLE FAST | FIRST EXPOSURE | — | — | 1 min. | 1 min. | 1 min. | 3 min. |
| | SECOND EXPOSURE | — | — | 2-3 min. | 2-3 min. | 2-5 min. | 12-14 min. |

*NOTE:
"W" denotes white fabric and "Y" denotes yellow fabric

TABLE II

MESH COUNT MULTIFILAMENT POLYESTER

| TYPE OF SYSTEM USED | | 6XX (74)** | 8XX (86) | 10XX (109) | 12XX (125) | 14XX (140) | 16XX (157) | 18XX (168) | 20XX (175) |
|---|---|---|---|---|---|---|---|---|---|
| RECLAIMABLE REGULAR | FIRST EXPOSURE | 1 min. | 1 min. | 1 min. | 1 min. | 1 min. | 1 min. | 1 min. | 1 min. |
| | SECOND EXPOSURE | 3-6 min. | 3-5 min. | 2-5 min. | 2-4 min. | 2-4 min. | 2-4 min. | 2-4 min. | 2-4 min. |
| RECLAIMABLE FAST | FIRST EXPOSURE | 1 min. | 1 min. | 1 min. | 1 min. | 1 min. | 1 min. | 1 min. | 1 min. |
| | SECOND EXPOSURE | 2-5 min. | 2-5 min. | 2-4 min. | 1-3 min. | 1-2 min. | 1-2 min. | 1-2 min. | 1-2 min. |

**NOTE:
Numbers in "( )" denote approximate threads per lineal inch

Although a number of variations and modifications have been described above, it will be appreciated that the invention encompasses all forms and concepts falling within the scope of the appended claims.

What is claimed is:

1. The method of reproducing a screen stencil image from an image on a transparent member for printing and like purposes comprising the steps of:
   filling the interstices of the screen and substantially covering both sides of the screen with spreadable uncured radiation curable material comprising an acidic constituent;
   placing the transparent member on one side of the screen in direct facing contact with the spreadable material;
   exposing the material through the transparent member to a radiation source for a time sufficient to at least partially cure and harden the material in the pattern of the image such that where cured the material hardens about the screen;
   again spreading a layer of the material on the side of the screen opposite the transparent member, to a depth greater than is desired for the final stencil;
   exposing the material to the radiation source through the transparent member for a second time sufficient to cure the material to a depth greater than the screen thickness but less than the total depth of the material;
   removing the transparent member from the cured layer;
   removing uncured material from the screen to leave open screen areas through which a printing medium may pass; and
   removing the stencil from the screen with immersion in an alkaline solution.

2. A method of making a screen stencil that is capable of reproducing lines of the order of 0.1 mm, has undercutting of less than 0.01 mm, excellent bridging characteristics, and a durability in excess of 50,000 copies comprising the steps of:

covering the screen filaments with a photopolymer that is essentially free of uncombined acrylates and has narrow band ultraviolet sensitivity and a spreadable but self supporting viscosity characteristic, and an attenuated ultraviolet transmissivity, the cured photopolymer having an elastomeric characteristic and negligible shrinkage, the screen filaments being covered by spreading a first photopolymer layer through the screen into contact with an underlying film master;

exposing the first layer until dry through the film master affixed directly thereto;

spreading a second photopolymer layer on the side opposite the film master while the film master is retained in position by the contacting layer;

exposing the photopolymer layers to ultraviolet radiadiation through the film master for a time sufficient to cure the photopolymer to a depth encapsulating the filaments, the time interval being selected relative to screen thickness to cure at least a portion of the second layer while bonding it to the first;

removing the film master image from the cured photopolymer;

removing uncured portions of the photopolymer; and postcuring by exposing the photopolymer to ultraviolet radiation from the direction opposite to the prior exposure for a time approximating the total time of the prior exposures.

3. The method as set forth in claim 2 above, wherein the second layer is spread with an excessive thickness greater than the final thickness desired, wherein the second exposure cures the second layer only to a predetermined thickness dependent upon the exposure time, and further including the step of removing the excess uncured material from the second layer after the second exposure.

4. The method as set forth in claim 3 above, further including the step of forming a pasteup film master by adhering separate film segments in a desired pattern to a thin transparent sheet, affixing the photopolymer to the sheet and stripping the sheet from the photopolymer after exposure.

5. The method as set forth in claim 4 above, wherein the transparent sheet is approximately 1 mil polyester and the film segments are adhered to the polyester with the emulsion side against the polyester.

6. A method of making a screen stencil that is capable of reproducing lines of the order of 0.1 mm, has undercutting of less than 0.01 mm, excellent bridging characteristics, and a durability in excess of 50,000 copies comprising the steps of:

overlying the screen on a film master;

covering the screen filaments with a wet photopolymer that contains an acidic constituent and that is essentially free of uncombined acrylates and has a narrow band ultraviolet sensitivity and a spreadable but self supporting viscosity characteristic, and an attenuated ultraviolet transmissivity, the cured photopolymer having an elastomeric characteristic and negligible shrinkage and being spread through the screen into contact with the underlying film master;

lowering the ultraviolet transmissivity of the photopolymer by the incorporation of a selected percentage, less than 1% by weight, of a black radiation absorbing particulate of approximately 56 nanometers average particle size;

exposing the photopolymer to ultraviolet radiation through the film master affixed directly thereto for a time sufficient to cure the photopolymer to a depth less than the thickness of photopolymer but encapsulating the filaments, the film master being retained in position relative to the screen solely by the wet photopolymer during irradiation;

removing uncured photopolymer and the film master from the cured stencil for the making of reproductions; and removing the stencil after use by contacting the stencil with an alkaline solution.

7. The method as set forth in claim 6 above, wherein the acidic constituent comprises in excess of 20% by weight of an ethylenically modified carboxylated monomer.

8. The method as set forth in claim 7 above, wherein the particulate is varied from approximately 0.10% for large mesh screens to approximately 0.68% for fine mesh screens.

9. The method of making a screen stencil from a film master comprising the steps of:

overlaying the screen on the film master;

spreading a thick layer of a wet photopolymer having a high sensitivity to radiation in the 360–380 nanometer band and an elastomeric property when cured across the screen and into contact with the underlying film master, the photopolymer including a light transmission limiting component and having a viscosity such that the wet photopolymer and film master remain in place despite handling of the screen;

irradiating the wet photopolymer layer through the image layer for a selected time related to the intensity of the irradiating source to cure photopolymer in the pattern of the film master to a depth less than the total thickness of photopolymer but encompassing both sides of the screen such that all filaments of the screen in exposed areas are encapsulated, the film master being retained in position relative to the screen solely by the wet photopolymer layer during irradiation; and removing uncured photopolymer and the film master from the cured stencil.

10. The method as set forth in claim 9 above, further including the step of irradiating the photopolymer layer from the side opposite the film master position after removal of uncured photopolymer, and where the light transmission limiting component is less than 1% by weight of a black radiation absorbing particulate of approximately 56 nanometers average particle size.

11. The method of making a screen stencil from a film master comprising the steps of:

overlaying the screen on the film master;

spreading a thick layer of a photopolymer having a high sensitivity to radiation in the 360–380 nanometer band and an elastomeric property when cured across the screen and into contact with the underlying film master, the photopolymer including a light transmission limiting component and having a viscosity such that the photopolymer and film master remain in place despite handling of the screen;

irradiating the photopolymer layer through the image layer for a selected time related to the intensity of the irradiating souce to cure photopolymer in the pattern of the film master to a depth less than the total thickness of photopolymer but encompassing both sides of the screen such that all filaments of the screen in exposed areas are encapsulated;

wherein the photopolymer is spread on one side of the screen in a first layer which is irradiated through the film master on the same side in a first exposure, and then a second layer of excess thickness is spread on the second side of the screen to penetrate into contact with the layer on the first side throughout the image region and wherein the irradiation of the second layer through the film master provides progressive curing to a predetermined limited depth that is uniform throughout the screen;

removing uncured photopolymer and the film master from the cured stencil; and irradiating the photopolymer layer from the side opposite the film master position after removal of uncured photopolymer.

12. The method as set forth in claim 11 above, wherein the screen is prestretched in a frame, the film master is initially disposed on a flat substrate of smaller dimensions than the frame and the film master is in direct contact with the photopolymer throughout the image area thereof such that minimum diffusion occurs.

13. The method as set forth in claim 11 above, wherein the film master comprises areal film segments disposed on a thin film in direct contact with the photopolymer layer.

14. The method of preparing a screen stencil comprising the steps of:

progressively layering photopolymerizable material containing radiation attenuating particulate through and onto the screen to surround the filaments thereof;

adhering a film master to the photopolymerizable material on one side of the screen at the initiation of the layering;

successively exposing the photopolymerizable material to activating radiation through the master during the progressive layering, to cure the material to a depth encapsulating the filaments of the screen in exposed regions;

removing excess uncured material from the side opposite the master;

removing the master from the cured layer and screen; and removing uncured material to leave the stencil image on the screen.

15. The method as set forth in claim 14 above, wherein the progressive layering comprises spreading a first layer through one side of the screen into contact with an underlying master adjacent the second side, exposure of the first layer through the master, deposition of a second layer having an excess thickness of material onto the first side of the screen into intimate contact with the first layer, and exposure of the second layer through the master and the previously exposed first layer, with internal reflection and absorption of the radiation limiting the depth of penetration in accordance with exposure time to provide a uniform cure depth that is less than the thickness of material available.

16. The method as set forth in claim 15 above, including the further step of disposing a cleaning and release facilitating agent on the side of the master facing the photopolymer prior to spreading of the photopolymer on the master.

17. A process for making a screen stencil with minimum undercutting, excellent bridging, high resolution and high durability comprising the steps of:

disposing a first layer of photopolymeric material on one side of the screen, the material having a viscosity sufficient to be retained by the screen despite handling in different orientations and being polymerizable in response to ultraviolet radiation, the material including less than 2% of a light absorbing additive;

affixing a photographic transparency bearing an image to the first layer of material in a position in which the image is to be reproduced as a stencil;

exposing the first layer of material to ultraviolet light through the transparency to at least partially cure the first layer in a pattern corresponding to the image of the transparency;

disposing a second layer of the photopolymeric material on the opposite side of the screen from the first layer, the second layer having an excess thickness of material;

exposing the material to ultraviolet light through the transparency for a time sufficient to cure the second layer to a selected depth and adhere and join to the first layer such that each filament of the screen in an exposed area is encapsulated in cured material;

removing excess uncured material from the second layer;

separating the photographic transparency from the first layer; and removing uncured photopolymeric material from the screen, whereby an image is embedded firmly on the screen and firmly united thereto.

18. The process as set forth in claim 17 above, wherein in addition the transparency is disposed on a flat substrate and underlies the screen and the first layer is disposed by spreading the thin layer from a first side of the screen through the screen onto underlying transparency, and wherein the second layer is disposed by spreading on the added photopolymeric material on the first side of the screen.

19. The process as set forth in claim 18 above, wherein the thickness of the stencil is in the approximate range of ¼ to 4 mils greater than the thickness of the screen.

20. The process as set forth in claim 19 above, wherein the thickness of the stencil is in the approximate range of ½ to ¾ mils greater than the thickness of the screen, wherein the stencil image is postcured by exposure to ultraviolet light on the second side for a time interval approximately equal to the total time of the prior exposures, and wherein the total exposure time is less than 10 minutes.

21. The process as set forth in claim 20 above, wherein the light absorbing particulate is a carbon black of less than 56 nanometers average particle size, and wherein the photopolymeric material is elastomeric when cured and is not bonded chemically to the surface of the filaments of the screen.

22. The process as set forth in claim 21 above, wherein the carbon black is less than 1% by weight of the photopolymeric material, and the viscosity of the photopolymeric material is in the range of 3000 to 10000 centipoise.

23. The method of making a screen stencil comprising the steps of:

at least partially curing a coating of photopolymer material on a first side of the screen while the film master is adhered thereto and held in position thereby;

layering an excess thickness of photopolymer material on the second side of the screen, the material being wet and nonself flowing under normal handling; and polymerizing the photopolymer material to a desired depth by exposure to radiation through the at least partially cured coating and the adhered master for a selected interval to completely encapsulate the screen.

24. The method as set forth in claim 23 above, wherein the cured material is from approximately ½ to ¾ mil thicker than the screen.

25. The method as set forth in claim 24 above, wherein the coating on the first side is of the same nonflowing wet photopolymer material as that on the second side.

26. The method as set forth in claim 25 above, wherein the photopolymer material contains a minor proportion of a radiation absorbing paticulate of approximately 56 nanometer average particle size.

27. The method as set forth in claim 26 above, wherein the photopolymer material is polymerizable in response to light in the 360–380 nanometer wavelength region and the radiation is provided by a source having substantial radiant energy in the 360–380 nanometer wavelength region.

28. The method as set forth in claim 27 above, including in addition the steps of stripping off the film master after the encapsulation, removing excess photopolymer from the screen, and removing uncured photopolymer from the screen.

* * * * *

UNITED STATES PATENT AND TRADEMARK OFFICE
CERTIFICATE OF CORRECTION

PATENT NO. : 4,291,116

DATED : September 22, 1981

INVENTOR(S) : Charles C. Tibbetts

It is certified that error appears in the above-identified patent and that said Letters Patent are hereby corrected as shown below:

Column 4, line 33, "3,982,492" should read --3,982,942--. Column 6, line 42, after "free", "radical" should read --radicals--. Column 7, line 53, after "employed" insert a period (--.--). Column 17, line 15, before "10", "scren" should read --screen--. Column 20, lines 61-62, "diminshed" should read --diminished--.

Signed and Sealed this

Eighth Day of December 1981

[SEAL]

*Attest:*

*Attesting Officer*

GERALD J. MOSSINGHOFF

*Commissioner of Patents and Trademarks*